(12) United States Patent
Ku et al.

(10) Patent No.: US 9,097,980 B2
(45) Date of Patent: Aug. 4, 2015

(54) TRANSMISSION BOX FOR RETICLE POD

(75) Inventors: Chen-Wei Ku, New Taipei (TW);
Pao-Yi Lu, New Taipei (TW);
Kun-Hong Liao, New Taipei (TW);
Jain-Ping Sheng, New Taipei (TW)

(73) Assignee: GUDENG PRECISION INDUSTRIAL CO, Ltd., New Taipei (TW)

( * ) Notice: Subject to any disclaimer, the term of this patent is extended or adjusted under 35 U.S.C. 154(b) by 978 days.

(21) Appl. No.: 13/250,395

(22) Filed: Sep. 30, 2011

(65) Prior Publication Data

US 2012/0267380 A1 Oct. 25, 2012

(30) Foreign Application Priority Data

Apr. 19, 2011 (TW) .............................. 100113499 A (51) Int. Cl.
*B65D 85/30* (2006.01)
*G03F 1/66* (2012.01)
*B65D 25/04* (2006.01)

(52) U.S. Cl.
CPC ...................................... *G03F 1/66* (2013.01)

(58) Field of Classification Search
USPC .................. 220/812, 554, 544, 661; 206/711; 312/9.48, 9.56, 270.3, 321, 330.1, 312/334.44
See application file for complete search history.

(56) References Cited

U.S. PATENT DOCUMENTS

| | | | |
|---|---|---|---|
| 5,390,785 A * | 2/1995 | Garric et al. ............... | 206/213.1 |
| 5,706,946 A * | 1/1998 | Kakizaki et al. ............. | 206/454 |
| 6,446,806 B1 * | 9/2002 | Ohori et al. .................... | 206/454 |
| 6,663,148 B2 * | 12/2003 | Bonora et al. ................ | 292/159 |
| 7,866,480 B2 * | 1/2011 | Burns et al. .................... | 206/711 |
| 2004/0012313 A1 * | 1/2004 | MacMillan .............. | 312/334.44 |
| 2004/0074808 A1 * | 4/2004 | Bhatt ............................ | 206/711 |
| 2007/0295627 A1 * | 12/2007 | Hsieh ............................ | 206/372 |

* cited by examiner

*Primary Examiner* — Mickey Yu
*Assistant Examiner* — Niki Eloshway
(74) *Attorney, Agent, or Firm* — Ming Chow; Sinorica, LLC (57) ABSTRACT

A transmission box using AMHS for transferring reticle pod is provided, wherein an OHT (Overhead Hoist Transfer) system is disposed on the transmission box to perform mechanical transferring of the reticle pod for greatly reducing risks of damaging reticles caused by operators when transferring, streamlining the allocation of operators, and thus decreasing the time needed for process to complete.

18 Claims, 11 Drawing Sheets

TRANSMISSION BOX FOR RETICLE POD

BACKGROUND OF THE INVENTION

1. Field of the Invention

The present invention is related to a transmission box, and more particularly, to a transmission box structure carrying a plurality of reticle pods, the structure of which and of AMHS are used for transferring the plurality of reticle pods.

2. Description of the Prior Art

Optical lithography tool plays an important role in the rapidly developing modern semiconductor technology. The pattern definition relies fully on optical lithography technology. In the application of optical lithography tool related to semiconductors, pre-designed circuit paths are fabricated into light-transparent reticles in specific forms. According to the principle of exposure, after light emitted from the light source passes through the reticle and is projected on a silicon wafer, specific circuit pattern can be exposed on the silicon wafer. However, since any kind of dust (such as particles, powders, and organic matters) that adheres to the reticle can result in quality degradation of projected pattern, the reticle used to produce pattern on silicon wafers is required to be kept absolutely clean. Therefore, a cleanroom environment is usually provided in ordinary wafer fabrication processes to prevent from contamination caused by particles in the air.

In semiconductor process, as the wafer size has progressed to the current 12" and is still increasing, wafer foundries have set up considerably high standards for automation. By employing computer-integrated manufacturing systems and AMHS, wafer foundries will be able to automatize 100% of its wafer transferring process and also greatly reduce errors caused by manual operation, increase product yield, and streamline factory management.

Figure 9:
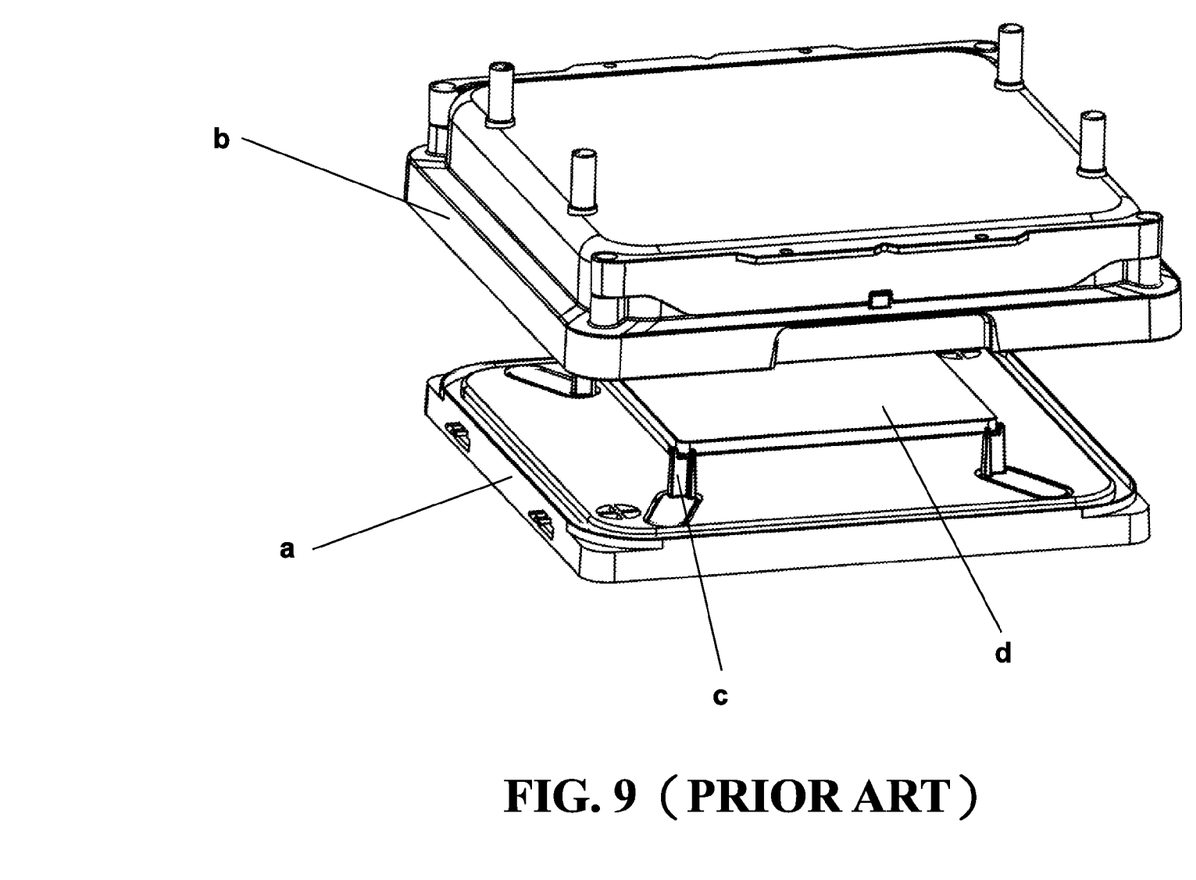
FIG. 9 is a view of a reticle pod of the prior art.

FIG. 9 is a view of a reticle pod already in use in semiconductor FAB; the reticle pod comprises: a bottom base a, an upper cover b opposite to the bottom base a, and a supporting piece c located on the bottom base a, wherein the supporting piece c supports a reticle d and the reticle d is enclosed within by the bottom base a and the upper cover b.

In a typical reticle transferring process, the reticle is placed in a reticle pod, which is a box in airtight status; therefore, the reticle can be protected from contamination of dust particles when it is placed in the reticle pod. Reticle pods are usually transferred manually by operators, who, for example, place a plurality of reticle pods on a cart and the reticle pods on the cart are transferred for the next stage of the process to be performed. However, in current process, the size of reticle has been continually increasing and its weight has also been increasing, and in manual handling and transferring processes, it is inevitable that reticle pods may sometimes drop and serious loss of cost may be caused. Moreover, when the wafer size has progressed to 12" or beyond, the whole wafer foundry may need to adopt automated systems for its production, and the transferring and handling of reticle pods should also be automatized to catch up with the trend; for example, a safest and fastest way to transfer a reticle pod is using a robot to handle it.

In view of the concerns mentioned above and to further prevent reticle pods from dropping when being transferred and to fulfill future requirements of wafer foundries for AMHS, provision of a transmission box which is able to safely and efficiently transfer a plurality of reticle pods is thus necessary.

SUMMARY OF THE INVENTION

In order to meet the aforementioned needs, one primary objective of the present invention is to provide a transmission box on which an OHT system with a structure same as that of reticle pod is disposed to co-operate with the AMHS for the transmission box to be mechanically transferred.

Another primary objective of the present invention is to provide a transmission box that is used for simultaneously transferring a plurality of reticle pods and co-operates with the AMHS for the transmission box to be mechanically transferred; by using such transmission box, risks of possible dropping of reticle pods during manual operation and cost losses can thus be avoided.

According to the objectives above, the present invention provides a front-opening transmission box, which comprises: a left side, a right side, an upper side, a lower side, a back side, and an opening; a door, the size of which is equivalent to that of the opening of the front-opening transmission box; an OHT (Overhead Hoist Transfer), which is disposed on the upper side of the transmission box; a pair of supporting frames, which are oppositely disposed on the left and right sides of the front-opening transmission box; a plurality of slide grooves, which are collaterally and oppositely formed on the pair of supporting frames and extend from the opening toward the back side; a plurality of first rollers, which are disposed on each of the slide grooves at the end of the opening; a plurality of placing boards, each of which is collaterally disposed on each pair of slide grooves; wherein, the characteristic of the placing boards is in that: each placing board has an upper surface and the upper surface has a plurality of ribs on its edge, and a pair of connection mechanisms corresponding to the slide grooves are disposed on the left and right sides of each placing board, the pair of connection mechanisms having a pair of channels corresponding to the first rollers.

By adopting the design provided by the present invention, not only can a plurality of reticle pods be transferred at the same time, but the risks of damages caused by manual operation can be greatly reduced, manpower can be saved, and time required for the process to complete can also be decreased.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

As the present invention discloses a front-opening transmission box used in semiconductor fabrication plants, and more particularly, a transmission box for simultaneously transferring a plurality of reticle pods; the positioning devices and OHT employed in the embodiments of front-opening transmission box of the present invention are achieved by using current technologies and the description of which is thus omitted. Moreover, the drawings of the front-opening transmission box referred to in the following description are not made according to the actual scale and only function as illustrations demonstrating characteristics of the present invention.

Figure 1:
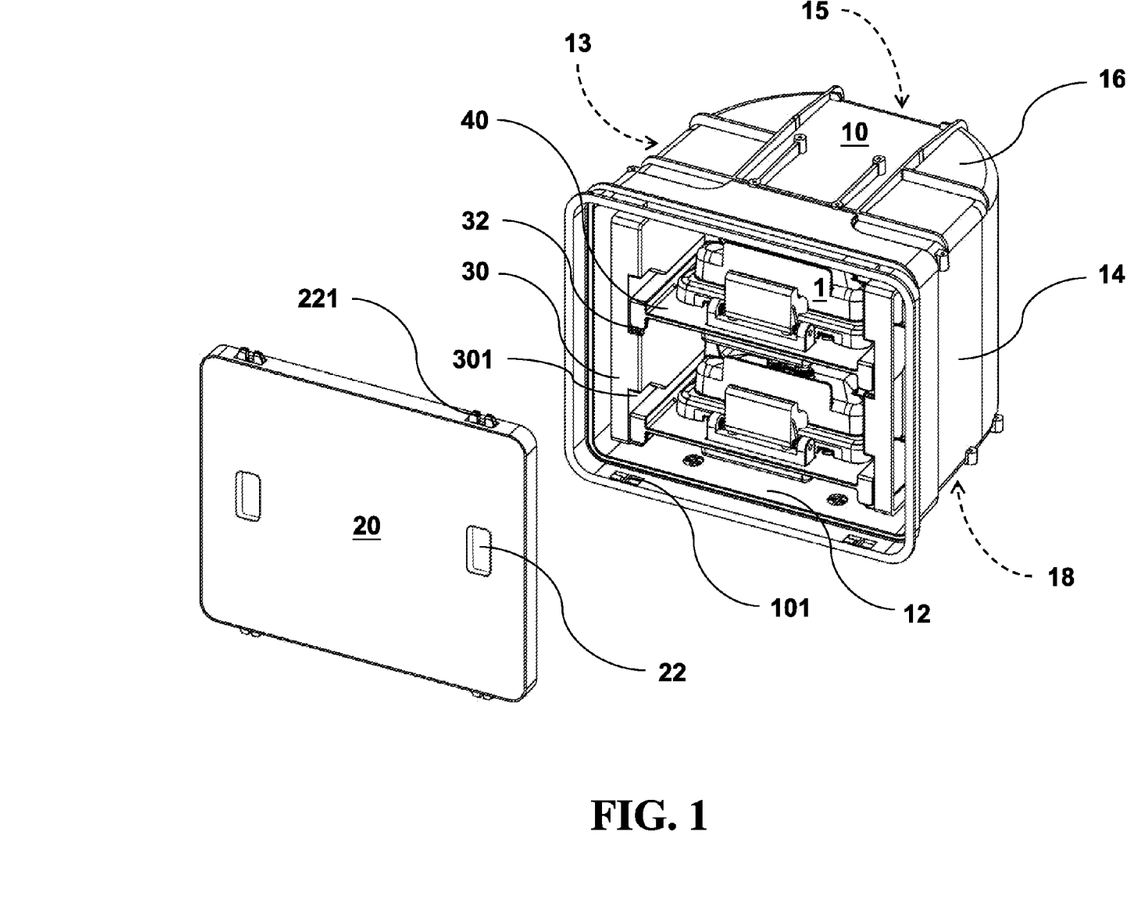
FIG. 1 is a view of the front-opening transmission box of the present invention.

First, referring to FIG. 1, which is a view of a front-opening transmission box of the present invention. A front-opening transmission box 10, as shown in FIG. 1, comprises: a left side 13, a right side 14, an upper side 16, a lower side 18, a back side 15, and an opening 12 opposite to the back side 15; a door 20, the size of which is equivalent to that of the opening 12 of the front-opening transmission box 10, used for closing the opening 12 of the front-opening transmission box 10; a pair of supporting frames 30 snap-fittingly and oppositely disposed on the left side 13 and the right side 14 of the front-opening transmission box 10 and extending from the opening 12 toward the back side 15, wherein a plurality of corresponding slide grooves 301 are collaterally formed on each of the supporting frames 30 and a first roller 32 is respectively disposed on each of the slide grooves 301 at the end of the opening 12; a plurality of placing boards 40, connection mechanisms 42 on two sides of which are connected with the slide grooves 301 on the supporting frames 30 for allowing the placing boards 40 to slide to and fro on the first rollers 32 on the slide grooves 301. In addition, the front-opening transmission box 10 is made of wear-resistant polymer material.

The door 20 of the present invention has a door latch device; a pair of latch devices 22 is disposed on the door 20, and an oval cam (not shown in the Figure) is used in each latch device 22 to be driven by rotation to push a pair of latches 221; the latches 221 slip out of the door 20 into the opposite holes 101 on the upper side 16 and the lower side 18 of the front-opening transmission box 10 for the door 20 to be securely lock-fastened onto the opening 12 of the front-opening transmission box 10. What is to be emphasized here is that, the latch device 22 can be designed to be operated either by pressing or rotating, and the primary function of which is to join the door 20 with the opening 12 of the front-opening transmission box 10 and keep the door 20 lock-fastened for preventing the door 20 or articles stored inside the transmission box 10 from separating or dropping. The door 20 can be mechanically or manually opened, which is not limited in the present invention. Moreover, what is to be emphasized here is that, the front-opening transmission box of the present invention primarily carries the reticle pod 1, and yet boxes or articles that are of equivalent size can also be carried, which is not limited in the present invention.

Figure 2A:
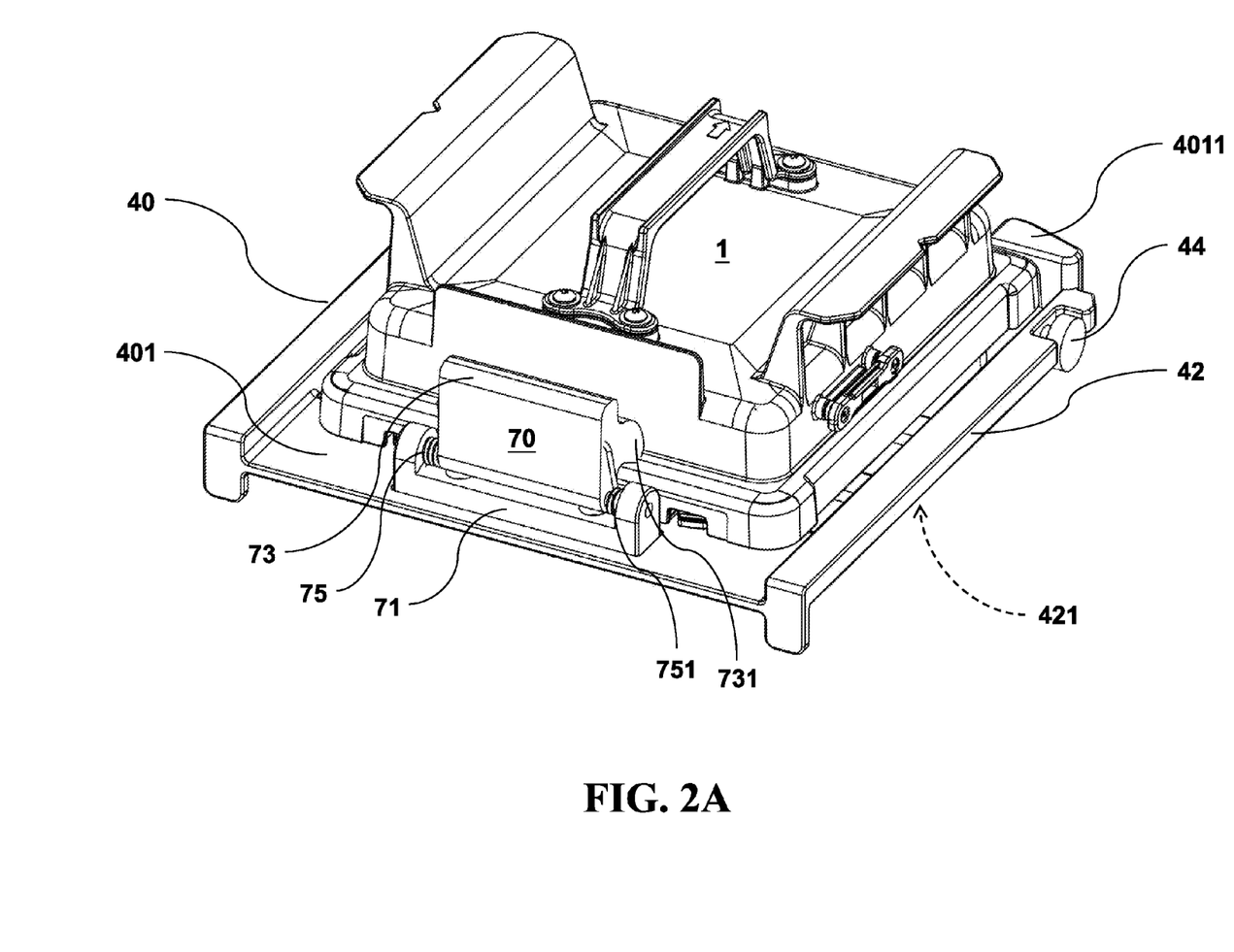
FIG. 2A is a view of the placing board of the present invention.

Then, referring to FIG. 2A, which is a view of a placing board of the present invention. As shown in FIG. 2A, the placing board 40 has an upper surface 401, on the rear end of which is a rib 4011 that protrudes from the upper surface 401. Moreover, a clipping device 70 is disposed near the front end of the placing board 40; the clipping device 70 comprises a base body 71, which is formed on the upper surface 401 on the front end of the placing board 40, and a clip 73, one end of which is pivotally connected to the base body 71 via a pivot 75 and the other end of which is a free end, the clip 73 being thus able to rotate perpendicular to the upper surface 401. In addition, a protruding portion 731 can be further formed on the clip 73 of the present invention and used for pressing against the reticle pod 1 placed on the upper surface 401 of the placing board 40. Moreover, in order for the clip 73 to firmly press against the reticle pod 1, the pivot 75 can be further disposed with an elastic piece 751 (such as a spring) that will be in contact with the clip 73 for increasing the pressing force of the clip 73 against the reticle pod 1.

Figure 2B:
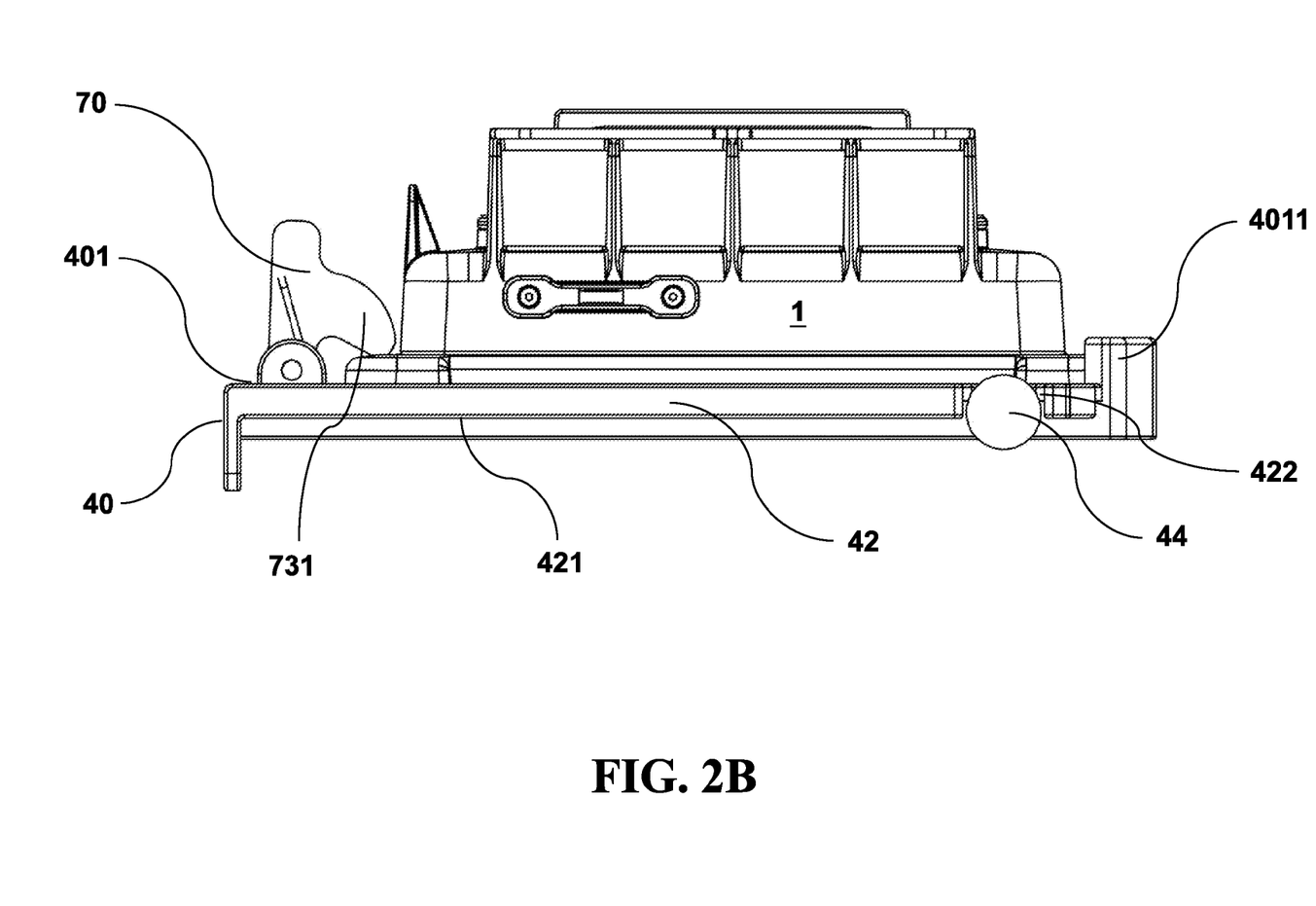
FIG. 2B is a side view of the placing board of the present invention.

Then, as shown in FIG. 2B, a pair of connection mechanisms 42 are formed on the two parallel sides of the placing board 40 between its front end and rear end. The pair of connection mechanisms 42 can be connected to the slide grooves 301 on the pair of supporting frames 30 and can be formed in the shape of channel or as an eave portion protruding out of the placing board 40 (not shown in Figure). When the connection mechanisms 42 and the slide grooves 301 on the supporting frames 30 are connected to each other, the connection mechanisms 42 are in contact with the first rollers 32 on the supporting frames 30 so that the placing board 40 can slide to and fro on the first rollers 32 on the slide grooves 301; in a preferred embodiment, the connection mechanisms 42 have a pair of channels 421 that correspond to the first rollers 32, the first rollers 32 being able to roll in the pair of channels 421. Moreover, in order for the placing board 40 to slide more smoothly, a pair of second rollers 44 can be further disposed on the rear end of the connection mechanisms 42; for example, a gap 422 is formed near the rear end of the connection mechanisms 42 and a pair of second rollers 44 are disposed in the gap 422, as shown in FIG. 2B. When the reticle pod 1 is placed on the placing board 40, the reticle pod 1 is prevented from moving in the transferring process with its rear end restricted by the rib 4011 and its front end clamped by the clip 73 of the clipping device 70. In addition, with the connection mechanisms 42 on two sides of the placing board 40 being connected to the slide grooves 301 of the supporting frames 30, the placing board 40, facilitated by the first rollers 32 on the slide grooves 301 or the second rollers 44 on the rear end of the connection mechanisms 42, is able to slide smoothly on the slide grooves 301 on the supporting frames 30.

Figure 3:
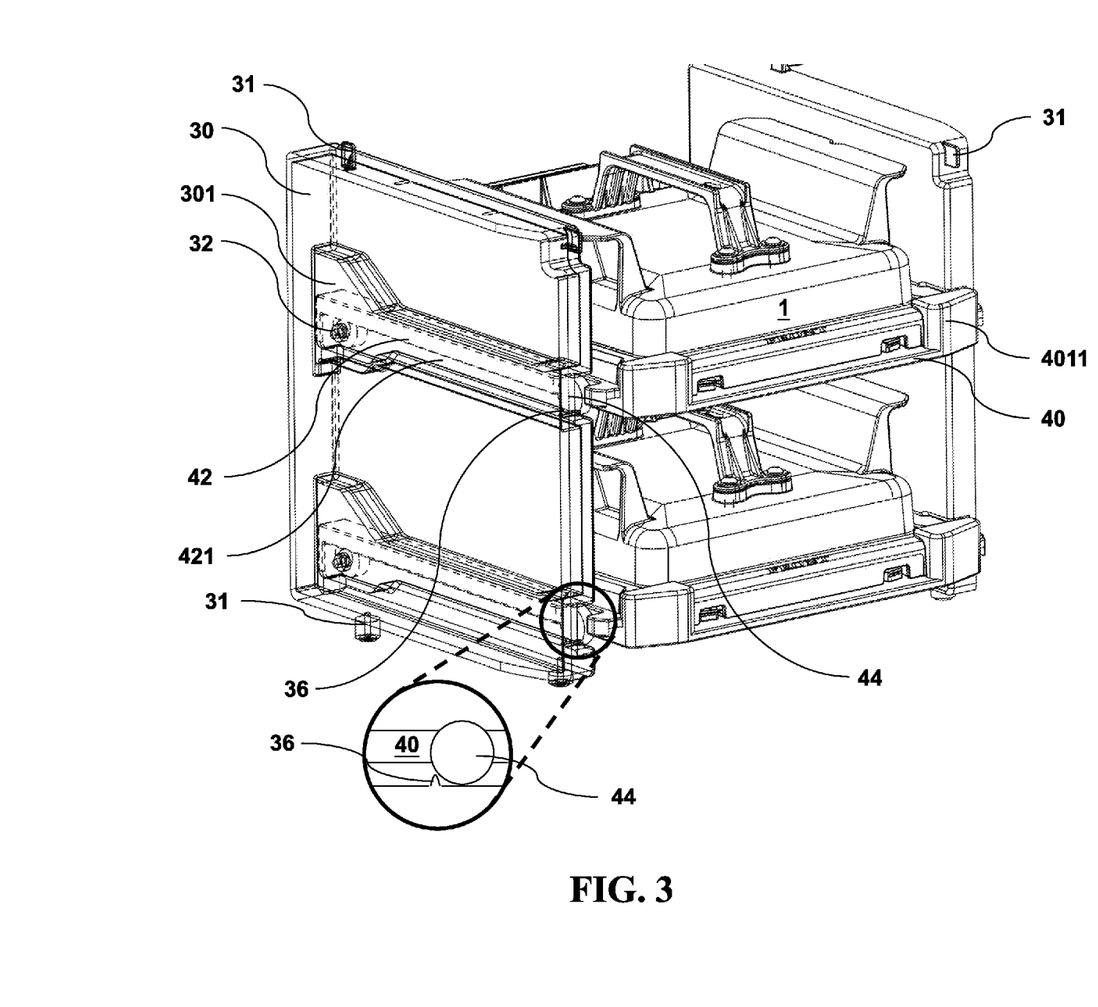
FIG. 3 is a view of the reticle pod of the present invention placed in the front-opening transmission box.

Referring to FIG. 3, which is a view of the reticle pod of the present invention placed on the supporting frames of the front-opening transmission box. As shown in FIG. 3, the supporting frames 30 of the present invention are snap-fittingly disposed on the left side 13 and right side 14 of the front-opening transmission box 10 via a plurality of tenons 31 on the supporting frames 30. Then, as shown in FIG. 2A, the reticle pod 1 is placed onto the placing board 40 and fastened by the clipping device 70, and the connection mechanisms 42 on the placing board 40 slide into the slide grooves 301 on the supporting frames 30; wherein, the first rollers 32 on the slide grooves 301 will be led into the channels 421 on the connection mechanisms 42, and the second rollers 44 will also slide into the slide grooves 301 along with the connection mechanisms 42. Therefore, as the first rollers 32 and the second rollers 44 roll, the placing board 40 can be smoothly drawn. Moreover, an arresting piece 36 is disposed at the rear end of the sliding grooves 301 of the supporting frames 30. The arresting piece 36 is a protrusive structure and its primary function is as thus: before the placing board 40 completely slides in, the second rollers 44 roll past the arresting piece 36, and the arresting piece 36, being a protrusive structure, functions as a stop structure that prevents the placing board 40 from sliding out after the second rollers 44 roll past the arresting piece 36 (just as a brick set under a wheel to prevent the wheel from rolling); when the placing board 40 slides past the arresting piece 36, it can be ensured that the placing board 40 is completely placed in the transmission box and thus incomplete placement of the placing board 40 can also be avoided.

Figure 4A:
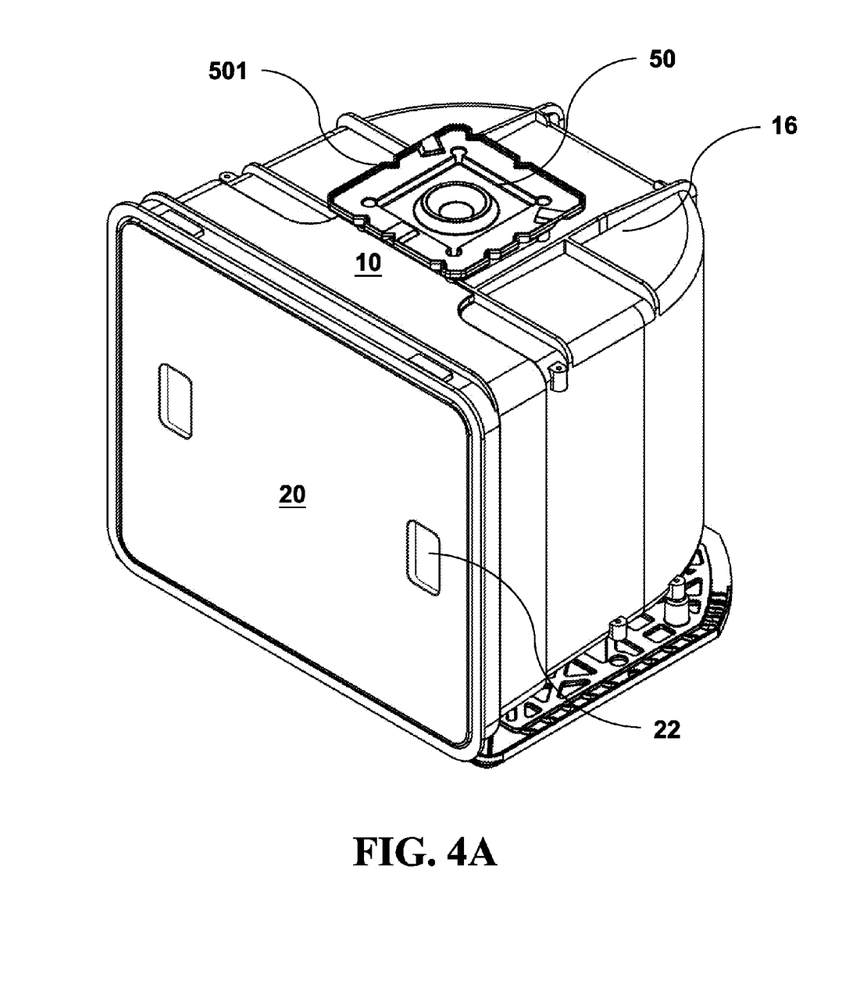
FIG. 4A is a view of the upper side of the front-opening transmission box of the present invention.

Then, referring to FIG. 4A, which is an upper side of the front-opening transmission box of the present invention. As shown in FIG. 4A, an OHT (Overhead Hoist Transfer) 50 is disposed on the upper side 16 of the front-opening transmission box 10, the OHT 50 is a rectangular protruding board with protruding periphery 501. In 12-inch wafer foundries, FOUP is mainly used for transferring wafers. As FOUP that is used to transfer wafers is of certain weight and cannot be easily carried manually by operators, AMHS is usually adopted in the process of handling FOUP and robots are used to clasp the protruding periphery of OHT 50 for transferring FOUP to platforms (such as a Load Port). And the protruding periphery 501 of the OHT 50 disposed on the upper side 16 of the front-opening transmission box 10 of the present invention also functions in a similar way: protruding periphery 501 of the same size and shape can be disposed for being clasped by a same robot, and, the OHT 50 can also be replaced with OHT 50 of different sizes and shapes to correspond to and co-operate with different machines; therefore, the size and shape of OHT 50 is not limited in the present invention, as long as its size and shape allow it to be clasped by robots. And the OHT 50 is either screw-locked on or tenon-fitted to the upper side 16 of the front-opening transmission box 10, the way of which is not limited in the present invention.

Figure 4B:
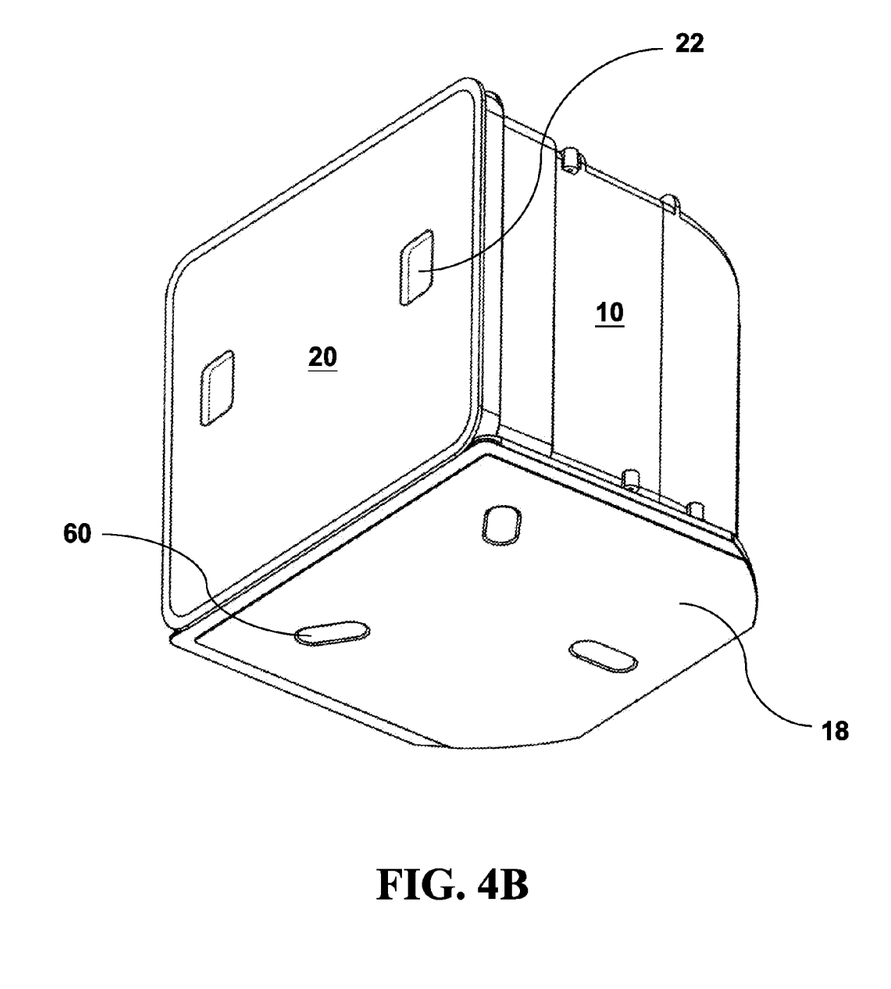
FIG. 4B is a view of the lower side of the front-opening transmission box of the present invention.

Then, referring to FIG. 4B, which is a view of the lower side of the front-opening transmission box of the present invention. As shown in FIG. 4B, the lower side 18 of the front-opening transmission box 10 is disposed with three, or a multiple of three, positioning grooves 60, each of which is a device with a cavity, and the positioning grooves 60 are deployed in a triangular disposition on the lower side 18. In wafer foundries, robots clasp a FOUP/transmission box 10 and carry it to a platform, on which are a plurality of positioning bolts (not shown in Figure) that correspond to the positioning grooves 60 on the bottom surface of the FOUP/transmission box 10; therefore, when the FOUP/transmission box 10 is placed on the platform, the positioning bolts on the platform insert into the positioning grooves 60 for the front-opening transmission box 10 to be securely placed on the platform.

Figure 5:
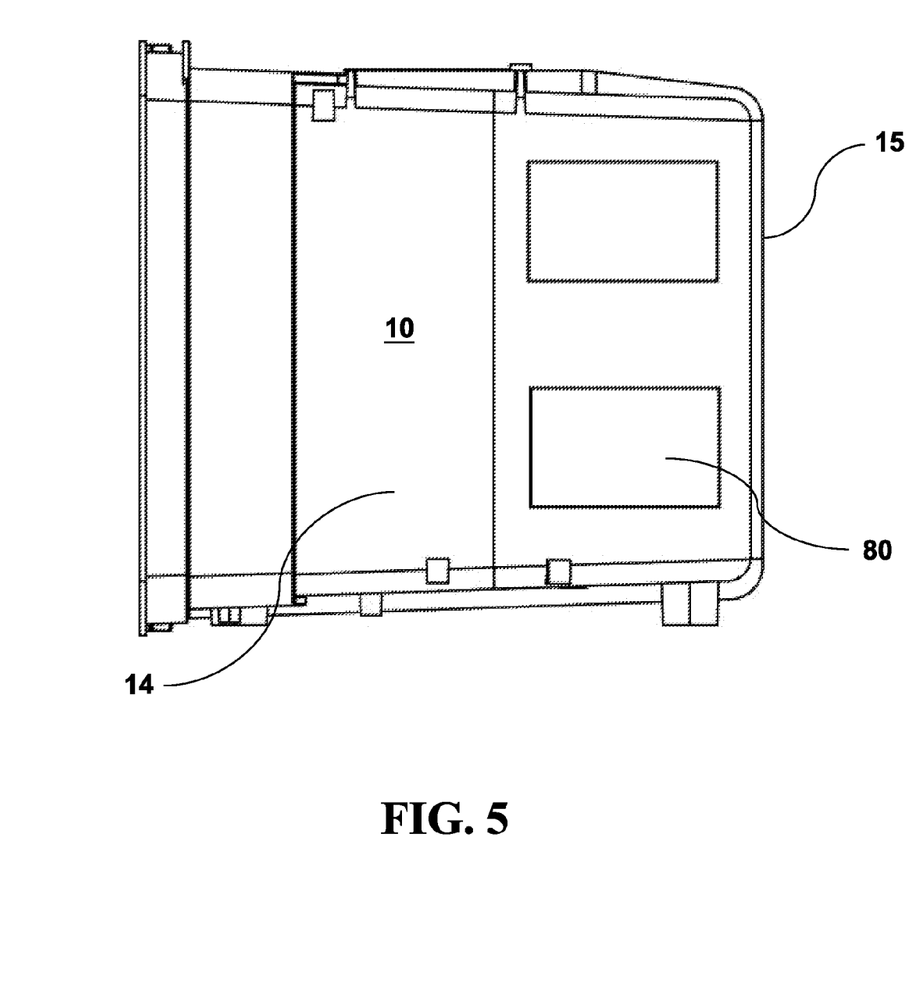
FIG. 5 is a view of another embodiment of the front-opening transmission box of the present invention.

Referring to FIG. 5, which is a view of another embodiment of front-opening transmission box of the present invention. As shown in FIG. 5, since the back side 15 of the front-opening transmission box 10 does not necessarily intersect the left side 13 and the right side 14 at right angles (may intersect in curves or recesses for example), therefore, when the reticle pods to be carried are larger ones (such as EUV pods), there may not be enough space in the front-opening transmission box 10. Thus, in the present embodiment, the joint surface between the back side 15 of the front-opening transmission box 10 and its left side 13 and right side 14 can be designed as a hollowed-out structure 80, the design of which allows a portion of an EUV pod to protrude out of the front-opening transmission box 10 and facilitates the placement of the whole EUV pod. In a preferred embodiment, the hollowed-out structure 80 can be disposed on the left side 13 and the right side 14 and close to the back side 15; moreover, the hollowed-out structure 80 can be multiple hollowed-out structures 80 arranged at intervals or one long-shaped hollowed-out structure 80, which is not limited in the present invention. Other details of the embodiment are the same as what are described above and are hereby omitted.

Figure 6:
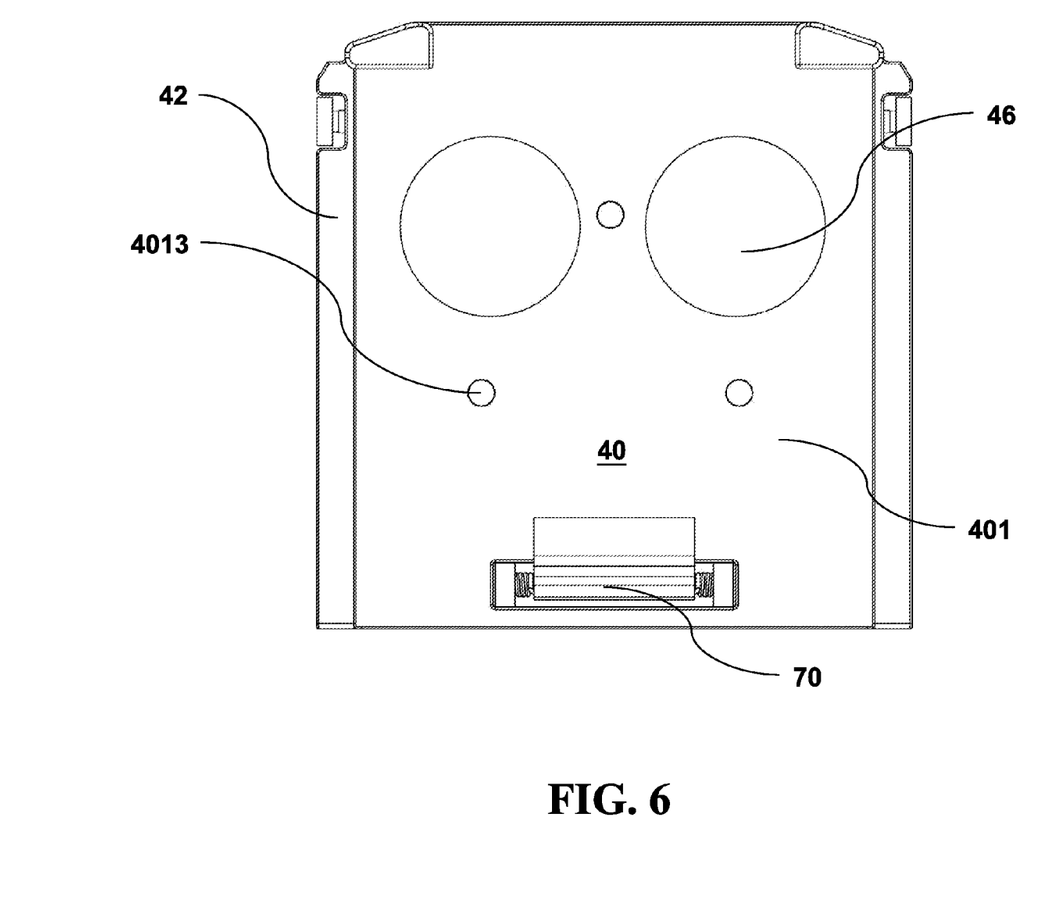
FIG. 6 is a view of the center-of-gravity structure of the placing board of the present invention.
Figure 7:
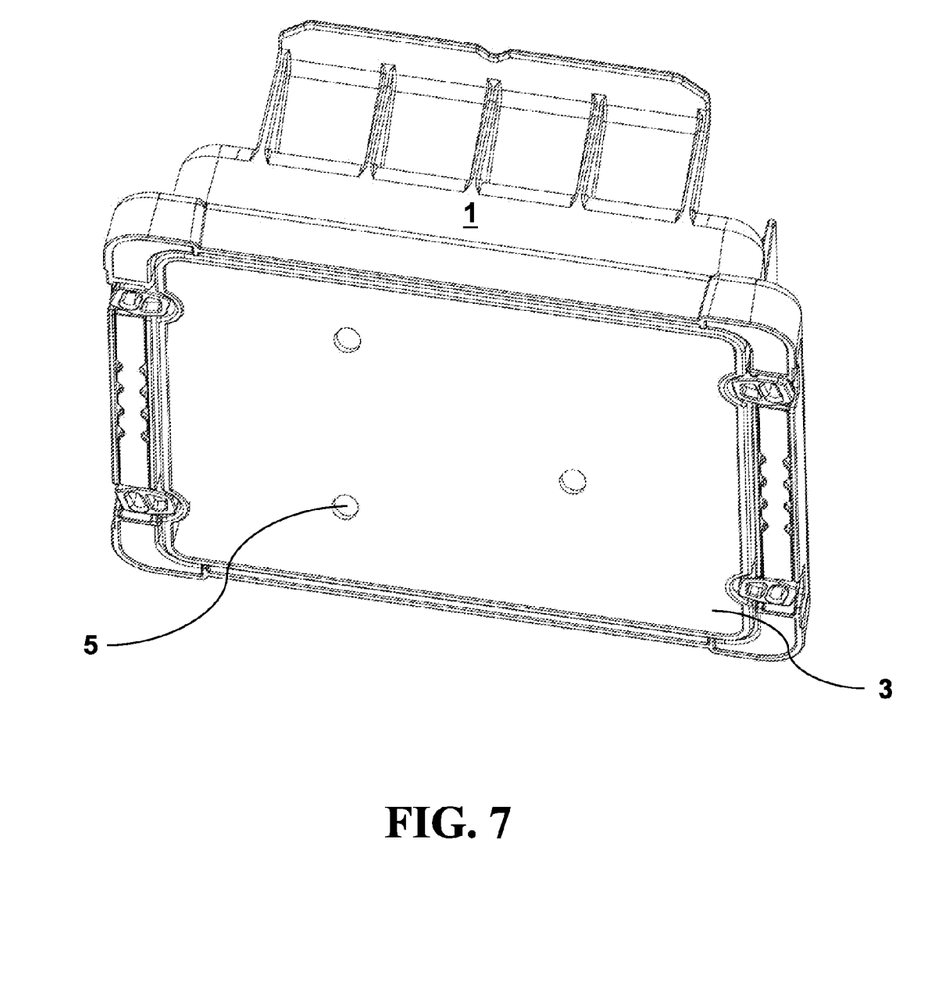
FIG. 7 is a bottom view of the reticle pod of the present invention.

Then, referring to FIG. 6, which is a view of the center-of-gravity structure of the placing board of the present invention. As shown in FIG. 6, at least a weight allocating structure 46 is further disposed on the surface of the placing board 40 of the present invention, the position of the weight allocating structure 46 being not limited and the weight allocating structure 46 being primarily made of metal. The objective of disposing a weight allocating structure 46 on the placing board 40 is mainly as thus: when the upper side 16 of the front-opening transmission box 10 is disposed with an OHT 50, the center of gravity of the box will shift forward and the transmission box will become unstable when it is suspended by the robot, and a weight allocating structure 46 is thus disposed on the placing board 40 to balance the center of gravity of the box so that the transmission box can be stably transferred in suspension. Moreover, the upper surface 401 of the placing board 40 is disposed with a plurality of foolproof structures 4013, which are deployed in triangular disposition in the present invention but is not limited. Then, as shown in FIG. 7, a plurality of foolproof notches 5 are disposed beneath the base board 3 of the reticle pod 1, each of the foolproof notches 5 corresponding to each of the foolproof structures 4013 on the upper surface 401 of the placing board 40; therefore, when being placed on the placing board 40, the reticle pod 1 needs to be aligned according to the foolproof structures 4013 due to the triangular disposition of the foolproof structures 4013, i.e. the foolproof notches 5 need to correspond to the foolproof structures 4013. The primary function of the foolproof structures 4013 is to prevent the reticle pod 1 from being placed in wrong directions and also to standardize the way of placement to facilitate the process.

Figure 8:
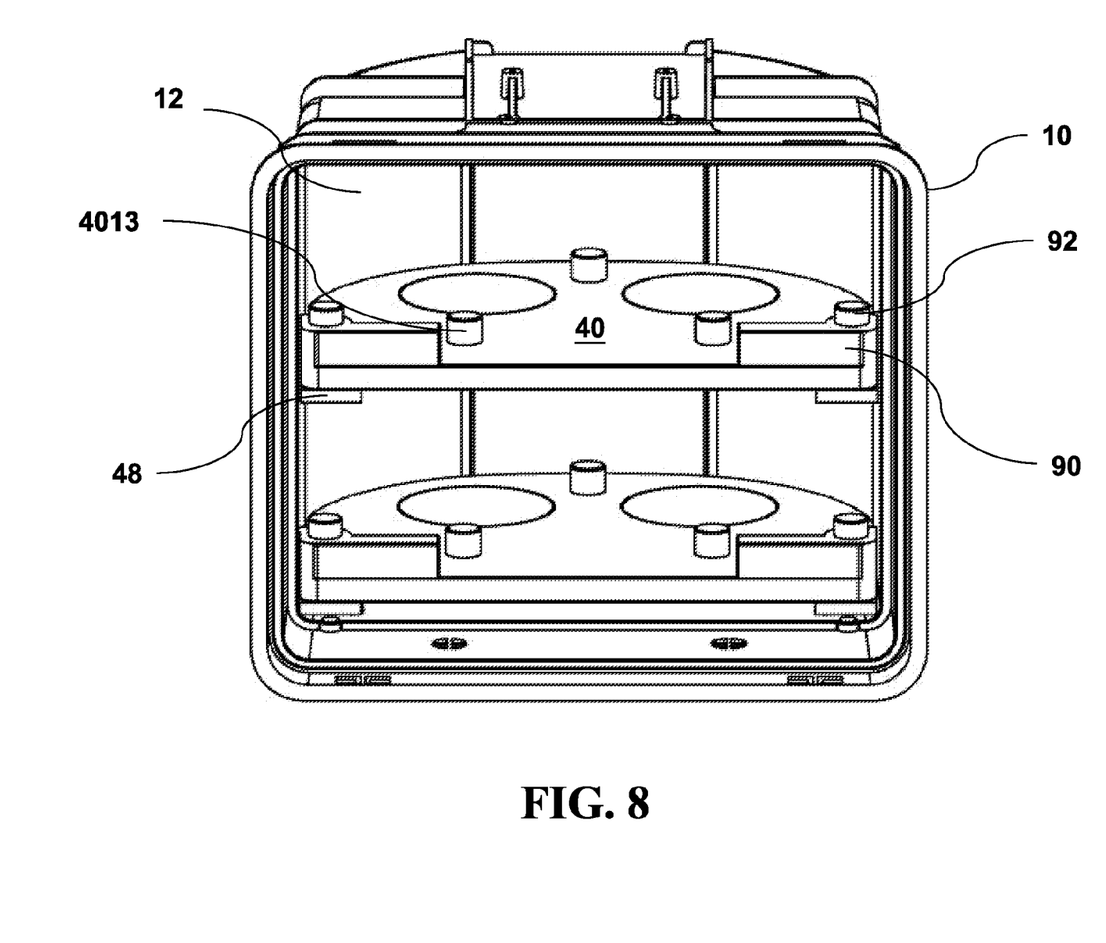
FIG. 8 is a view of still another embodiment of the front-opening transmission box of the present invention.

Referring then to FIG. 8, which is a view of still another embodiment of the front-opening transmission box of the present invention. The front-opening transmission box 10, as shown in FIG. 8, comprises: a left side 13, a right side 14, an upper side 16, a lower side 18, a back side 15, and an opening 12 opposite to the back side 15; a door 20, the size of which is equivalent to that of the opening 12 of the front-opening transmission box 10, used for closing the opening 12 of the front-opening transmission box 10; a plurality of supporting ribs 48 correspondingly disposed on the inner sides of the left side 13 and the right side 14 of the front-opening transmission box 10, each supporting rib 48 extending from the opening 12 toward the back side 15; a plurality of placing boards 40, placed on a corresponding pair of supporting ribs 48; a plurality of buckles 90 respectively disposed on one end of each of the placing boards 40 at the opening 12, one end of each buckle 90 being pivotally connected to a fixing pin 92, each fixing pin 92 fastening each buckle 90 to each placing board 40 and allowing each buckle 90 to swing out of and into the opening 12; similarly, the fixing pin 92 can be further disposed with an elastic piece such as a spring (not shown in Figure), and the elastic piece can be disposed inside the buckle 90 for increasing the pressing force of the buckle 90.

The way of operation of the present embodiment is described in the following. When the reticle pod 1 is placed on the placing board 40, the buckles 90 on the placing board 40 at the opening 12 clasp the reticle pod 1, and the connection mechanisms 42 on the placing board 40 that carries the reticle pod 1 are aligned with the corresponding supporting ribs 48 disposed on the left side 13 and the right side 14 of the front-opening transmission box 10 for the placing board 40 to enter the front-opening transmission box 10; finally, the door 20 is used to close the opening 12 of the front-opening transmission box 10.

Apparently, in the front-opening transmission box 10 of the present embodiment, a plurality of supporting ribs 48 are used to substitute the supporting frames 30 so that the placing boards 40 can be directly placed on the supporting ribs 48, the supporting ribs 48 forming a plurality of spaces for accommodating reticle pods in the front-opening transmission box 10; moreover, buckles 90 are used to substitute clipping devices 70. Except for these, the front-opening transmission box 10 and the placing boards 40 are similar to those described in FIG. 1 and FIG. 2A and FIG. 2B, and the differences are previously described and are herein omitted.

Although the present invention has been described with reference to the aforementioned preferred embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

What is claimed is:

1. A front-opening transmission box, in which a plurality of storage devices can be placed, said front-opening transmission box comprising a left side, a right side, an upper side and a lower side that are joined together with a back side; an opening that is opposite to said back side; a door, the size of which is equivalent to said opening of said front-opening transmission box, said door being used for closing said opening of said front-opening transmission box, the characteristic of said front-opening transmission box being in: a pair of supporting frames, oppositely disposed at inner sides of said left side and of said right side of said front-opening transmission box; a plurality of slide grooves, being collaterally and oppositely formed on said pair of supporting frames and extending from said opening toward said back side of said front-opening transmission box; and a plurality of placing boards, each of said plurality of placing boards being collaterally disposed on each of said plurality of slide grooves; wherein, each of said placing boards comprises:
    an upper surface, said upper surface having a rib on its rear end, a pair of connection mechanisms corresponding to said plurality of slide grooves being disposed on the left and right sides connected to said rib, said connection mechanisms being engaged with said plurality of slide grooves;
    wherein said upper surface of each of said placing boards is further disposed with a clipping device.

2. The transmission box according to claim 1, wherein each of said slide grooves is disposed with a first roller at the end of said opening of said front-opening transmission box.

3. The transmission box according to claim 2, wherein said pair of connection mechanisms have a pair of channels that correspond to said first rollers.

4. The transmission box according to claim 1, wherein a gap is disposed near a rear end of said connection mechanism of each of said placing boards, and a second roller is further disposed at said gap.

5. The transmission box according to claim 1, wherein each of said slide grooves is disposed with an arresting piece.

6. The transmission box according to claim 1, wherein said upper surface of each of said placing boards is further disposed with a foolproof structure.

7. The transmission box according to claim 1, wherein said lower side is further disposed with a plurality of positioning grooves.

8. The transmission box according to claim 1, wherein said left side and said right side that are joined with said back side of said front-opening transmission box are respectively a hollowed-out structure.

9. A front-opening transmission box, in which a plurality of storage devices can be placed, said front-opening transmission box comprising a left side, a right side, an upper side and a lower side that are joined together with a back side; an opening that is opposite to said back side; a door, the size of which is equivalent to said opening of said front-opening transmission box, said door being used for closing said opening of said front-opening transmission box, the characteristic of said front-opening transmission box being in: a plurality of pairs of supporting ribs, being collaterally and oppositely formed at inner sides of said left side and of said right side of said front-opening transmission box and extending from said opening toward said back side of said front-opening transmission box; and a plurality of placing boards, each of said plurality of placing boards being collaterally disposed on each of said pairs of supporting ribs; wherein, each of said placing boards comprises:
    an upper surface, said upper surface having a rib on its rear end, a pair of connection mechanisms corresponding to said pair of supporting ribs being disposed on the left and right sides connected to said rib, said connection mechanisms being engaged with said pair of supporting ribs; and
    a plurality of buckles, disposed on said upper surface of each of said placing boards at said opening;
    wherein one end of each of said buckles is pivotally connected to a fixing pin, said fixing pin fastening each of said buckles to each of said placing boards and allowing each of said buckles to swing out of and into said opening.

10. The transmission box according to claim 9, wherein a gap is disposed near a rear end of said connection mechanism of each of said placing boards, and a second roller is further disposed at said gap.

11. The transmission box according to claim 9, wherein each of said slide grooves is disposed with an arresting piece.

12. The transmission box according to claim 9, wherein said upper surface of each of said placing boards is further disposed with a clipping device.

13. The transmission box according to claim 9, wherein said upper surface of each of said placing boards is further disposed with a foolproof structure.

14. The transmission box according to claim 9, wherein each of said placing boards is further disposed with a center-of-gravity structure.

15. The transmission box according to claim 9, wherein said lower side is further disposed with a plurality of positioning grooves.

16. The transmission box according to claim 9, wherein said left side and said right side that are joined with said back side of said front-opening transmission box are respectively a hollowed-out structure.

17. A front-opening transmission box, in which a plurality of storage devices can be placed, said front-opening transmission box comprising a left side, a right side, an upper side and a lower side that are joined together with a back side; an opening that is opposite to said back side; a door, the size of which is equivalent to said opening of said front-opening transmission box, said door being used for closing said opening of said front-opening transmission box, the characteristic of said front-opening transmission box being in: a pair of supporting frames, oppositely disposed at inner sides of said left side and of said right side of said front-opening transmission box; a plurality of slide grooves, being collaterally and oppositely formed on said pair of supporting frames and extending from said opening toward said back side of said front-opening transmission box; and a plurality of placing boards, each of said plurality of placing boards being collaterally disposed on each of said plurality of slide grooves; wherein, each of said placing boards comprises:

an upper surface, said upper surface having a rib on its rear end, a pair of connection mechanisms corresponding to said plurality of slide grooves being disposed on the left and right sides connected to said rib, said connection mechanisms being engaged with said plurality of slide grooves; and  at least a weight allocation structure, disposed on said upper surface.

18. The transmission box according to claim 17, wherein said upper surface of each of said placing boards is further disposed with a clipping device.

\* \* \* \* \*